United States Patent
Hokenmaier

(12) 
(10) Patent No.: US 6,759,894 B2
(45) Date of Patent: Jul. 6, 2004

(54) METHOD AND CIRCUIT FOR CONTROLLING FUSE BLOW

(75) Inventor: Wolfgang Hokenmaier, Burlington, VT (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/284,995

(22) Filed: Oct. 31, 2002

(65) Prior Publication Data

US 2004/0085119 A1 May 6, 2004

(51) Int. Cl.[7] ............................................. H01H 37/76
(52) U.S. Cl. ........................................................ 327/525
(58) Field of Search .................................. 327/524, 525, 327/526

(56) References Cited

U.S. PATENT DOCUMENTS 5,847,987 A * 12/1998 Cutter et al. .................. 365/96
6,456,149 B2 * 9/2002 Cutter et al. ................. 327/525

* cited by examiner

*Primary Examiner*—Jeffrey Zweizig

(57) ABSTRACT

A method and circuit for controlling fuse blow including sending signals to a plurality of fuse latches, sending fuse select signals to a blow control circuit to determine if a fuse should be blown or not, activating a delay timer after a fuse is blown to control after-blow time. After the delay timer has expired, issuing a Stop signal that causes the blow control circuit to shut off a blow device. This process continues until successful blow completion of all to-be-blown fuses.

17 Claims, 7 Drawing Sheets

| Blow_Go | Select | Blow_Stop | Blow | Go_Next |
|---|---|---|---|---|
| 0 | X | X | 0 | 0 |
| 1 | 0 | X | 0 | 1 |
| 1 | 1 | 0 | 1 | 0 |
| 1 | 1 | 1 | 0 | 1 |

FIG. 7

METHOD AND CIRCUIT FOR CONTROLLING FUSE BLOW

FIELD OF THE INVENTION

This invention relates to automatic serial fuse blow circuits utilizing electrical fuses.

BACKGROUND OF THE INVENTION

Memory devices, such as dynamic random access memory devices (DRAM) typically include fuse circuits. Fuses included in these fuse circuits may be employed to activate redundant elements which replace failing cells or components.

Fuses may be grouped into two classes, for example, laser fuses and electrical fuses. Laser fuses are blown by a chip-external laser beam which irradiates specific fuses to supply enough energy to blow the fuses. Electrical fuses are blown when a current through the fuses exceeds a threshold causing energy build-up to blow the fuse. Electrical fuses are often utilized for modern semiconductors. Electrical fuses allow for adjustments and repairs to be performed as late as in the packaged chip. Also, electrical fuses are likely to replace laser fuses since electrical fuses allow for more design flexibility, for example, fuse position within the chip, wiring above the fuse and wiring below the fuse.

Known electrical fuses can be a wire type or a semiconductor layer type. For the wire type, a relatively low-resistive element, such as a wire, increases its resistance permanently once a high current stresses this element. The stressed wire creates an opening similar to traditional laser-fuses. For the layer type fuse, a high-resistive layer between conductive layers permanently decreases its resistance from a high voltage or consecutive current, leading to a break-down of this layer. For example, an isolator or dielectric material which starts to break through at a certain voltage level and stays permanently damaged forming a low resistive path. The first type of fuse will be referred to as type A; the second type of fuse will be referred to as type B.

One of the major differences between laser fuses and electrical fuses is the manner in which the fuses are addressed or accessed, so that the fuses can be blown. For laser fuses, the laser beam is simply pointed at the fuses which are to be blown, that is, addressing by location. Unlike laser fuses, electrical fuses are not blown using addressing by location, electrical fuses are blown by accessing pins of a chip.

It is desirable for electrical fuses to play an increasing role in higher density memory devices. Considering the large number of fuses typically found on DRAM circuits, if standard decoding schemes are applied, the selection of an electrical fuse that should be blown either requires a large amount of decoder circuitry or many address wires on a chip.

It is often considered a disadvantage of electrical fuses that the actual time, from the moment that the fuse starts to blow until the fuse is completely blown, is not instantaneous. The moment when the fuse starts to blow, is the moment when the current through the fuse starts to decrease for type A and starts to increase for type B.

To get a reliable and permanent change of resistance, especially for the fuse type B, it is desirable to be able to control the after-blow current and the time period during which this current is applied. If the fuses are blown by applying a certain voltage or current for a certain predetermined blow time $t_{appl}$, then this predetermined blow time needs to be chosen at or above the upper end of the statistical time distribution to achieve a high fuse blow success rate. However, the after-blow time is then unknown. The range of the after-blow time will vary across the whole blow time distribution ($t_{min}$ thru $t_{max}$) and will be in between times, $t_{appl}-t_{max}$ and $t_{appl}-t_{min}$. Using the predetermined blow time $t_{appl}$ for each fuse can result in very long blow times. For example, if this concept is used to repair modern DRAMs using redundant elements with thousands of fuses per chip, then the blow time will be very long since the blow time will be related to the number of fuses to be blown. Therefore, attempts are made to blow the fuses in parallel to shorten the total blow time. Blowing the fuses in parallel creates additional problems and obstacles for both types of fuses.

For type A fuses, it is theoretically possible to blow fuses in parallel assuming enough current can be provided to assure the desired stress conditions. Wiring limitations will create additional resistance. Therefore, the stress conditions will be different from the first-blowing fuse, which uses the lowest voltage and individual current due to the highest overall current, to the last blowing fuse, which uses the highest voltage and current due to lowest overall current. The lower individual voltage and current at the beginning of the parallel blow attempt can have an influence on the dynamic process of the fuse-blow and on the predetermined blow time $t_{appl}$ needed.

For type B fuse parallel blow, the voltage will be highest for the first-blowing fuse having minimal current as long as all the fuses are high-resistive. The voltage will be lowest for the last-blowing fuse. A harder-to-blow fuse will use a reduced voltage after the initial high voltage which blew its neighboring fuses. This harder-to-blow fuse, which was not destroyed at the initial high voltage level, will certainly demonstrate an even greater reluctance to being blown at a lower voltage level. Maximum blow time $t_{max}$ will increase and it will be even harder to specify a predetermined blow time $t_{appl}$.

A need therefore exists fogs a fuse blow control circuit which makes parallel fuse blow unnecessary, therefore, avoiding the problems mentioned above.

SUMMARY OF THE INVENTION

According to a preferred embodiment of the present invention, a fuse blow control circuit is provided wherein the blow time is self-regulating, every fuse takes its own tome needed to blow plus an additional adjustable or predefined after-blow time. The blow process and success can be monitored and parts of the circuit with faulty fuses can be sorted out immediately.

The fuse blow process can be an automatic serial process. For example, control signals are not required once the process is started. After expiration of a predetermined time period, fuse blow success can be monitored by a tester using a monitoring device. The predetermined time period can be calculated based on a fuse string, on a chip by chip basis, or the predetermined time period can simply be chosen so that it fits a worst-case scenario test case. If fuse blow success is detected by a tester then no further testing of the fuses is necessary. However, the monitoring of fuse blow success can be repeated if there are additional fuses to be blown. Furthermore, if it is desirable to increase fuse reliability, or to blow fuses again in case the fuses have failed after stress, the tester can adjust the predetermined time period and can continue to monitor fuse blow success.

An embodiment of the invention includes a method for controlling fuse blow. The method can have the following steps: feeding a Blow_Go signal into a fuse latch then blowing a fuse. After the fuse is blown, automatically gating through the Blow_Go signal to another fuse latch. The steps of gating through the Blow_Go signal and blowing fuses are repeated until successfully blowing all of the to-be-blown fuses.

Another embodiment of the present invention includes feeding a Select signal into a blow control circuit. Once the Select signal is fed into the blow control circuit, the Select signal is evaluated to determine if a Blow_Go signal should blow the fuse. If the fuse is not to be blown, then the Blow_Go signal is automatically gated through to the next fuse latch. If the fuse is to be blown, the blow control circuit blows the fuse, shuts off the device that is connected to the fuse and automatically gates through the Blow_Go signal to the next fuse latch. The automatic gate through of the Blow_Go signal and evaluation of the Select signal keep repeating until successfully blowing all of the to-be-blown fuses.

In a further embodiment of the present invention, a delay timer waits for a fuse to be blown. After the delay timer detects that a fuse is blown, the delay timer is started. The delay timer will control the after-blow time of the fuse before shutting off the device that is connected to the fuse. Once the delay timer is started, further fuse blow processing waits until the delay timer has expired. After the delay timer has expired, a Blow_Stop signal is issued that causes a blow control circuit to shut off the device that is connected to the fuse.

Another embodiment of the present invention includes a circuit configuration that processes a digital input signal. The circuit configuration includes a blow control circuit that has an input side for receiving a Blow_Go signal. The circuit configuration also has a blow transistor for blowing at least one fuse. The blow transistor will blow a fuse if a Blow_signal is received and the fuse string information indicates that the fuse should be blown. Additionally, the circuit configuration has an output side for supplying a Blow_Go signal to a next fuse latch for possible further fuse blow processing after fuse processing within the current fuse latch is completed.

A further embodiment of the circuit configuration can include an input side for receiving a Select signal. The blow control circuit can have a signal evaluator circuit for evaluating the Select signal. Upon evaluation of the Select signal by the signal evaluator circuit, a determination is made as to whether or not the fuse should be blown. If the signal evaluator circuit determines that a fuse is to be blown based on the Select signal, the Blow_Go signal will activate the blow transistor that will blow at least one of the fuses.

An embodiment of the circuit configuration can also include a delay timer circuit. The delay timer circuit controls the after-blow time of the fuse. The delay timer circuit waits for a fuse to be blown. Once a fuse is blown the delay timer circuit is activated. Further fuse blow processing waits until expiration of a time period controlled by the delay timer circuit. Once the delay timer has expired, the blow device that is connected to the blown fuse is shut off. Then, the output side of the circuit configuration will supply a Blow_Go signal to a next fuse latch. The circuit configuration will repeat this process until all of the to-be-blown fuses are successfully blown.

BRIEF DESCRIPTION OF THE DRAWINGS

FIG. 7 is a table illustrating signal processing of a fuse blow control circuit according to an embodiment of the present invention.

DETAILED DESCRIPTION OF PREFERRED EMBODIMENTS

Figure 1:
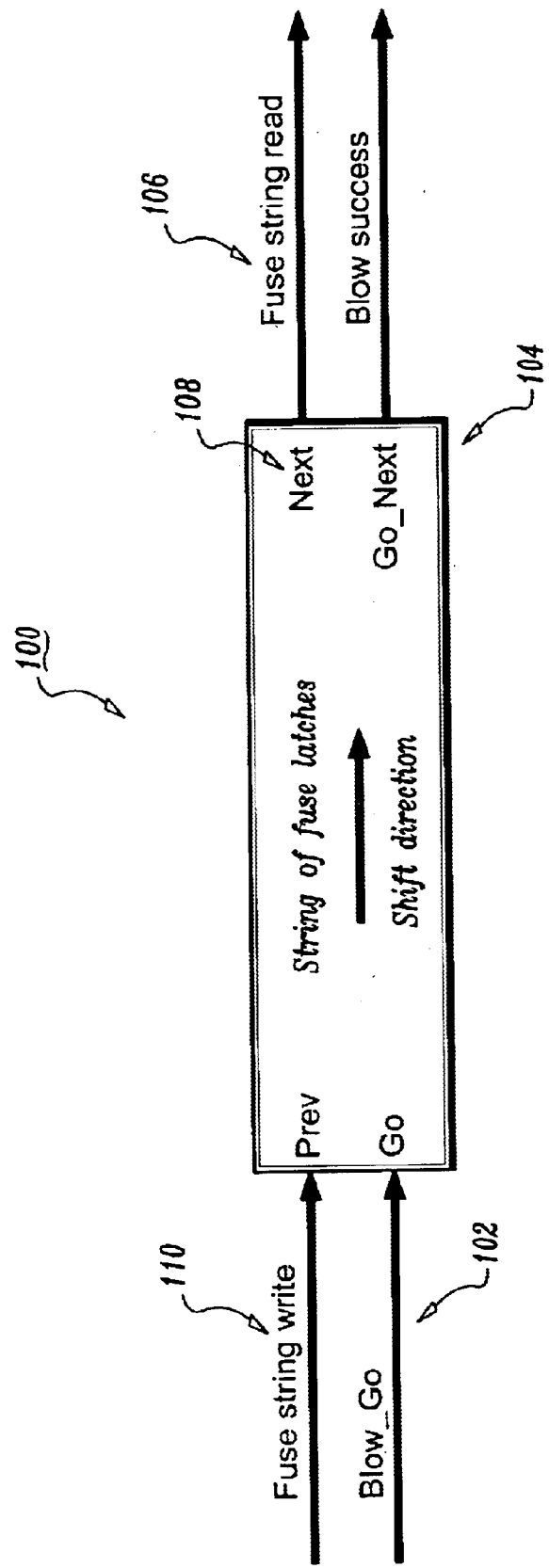
FIG. 1 depicts the input and outputs to and from a string of a plurality of fuse latches.

Referring to FIG. 1, automatic serial fuse blow is performed on a plurality of fuse latches 100 that are serially connected to each other as a string. Fuse blow is controlled by a Blow_Go signal 102 which is fed into the plurality of fuse latches. Once a fuse within a fuse latch 100 is blown or if the fuse string information within the fuse latch 100 indicates that the fuse does not need to be blown, the Blow_Go signal 102 is automatically gated through to the next fuse latch and so on. This process is repeated until the output of the last fuse latch, which is the Go_Next signal 104, indicates the successfully completed blow of all to-be-blown fuses within the string of a plurality of fuse latches 100. This process can be combined with an easy addressing scheme when the fuse latches are part of a shift register configuration. The fuse blow information can be written serially, fuse string write 110, as a fuse string and stored within a fuse latch. This shift register configuration also allows a read of fuse-latch status information, fuse string read 106, that indicates if a fuse has been blown.

Figure 2:
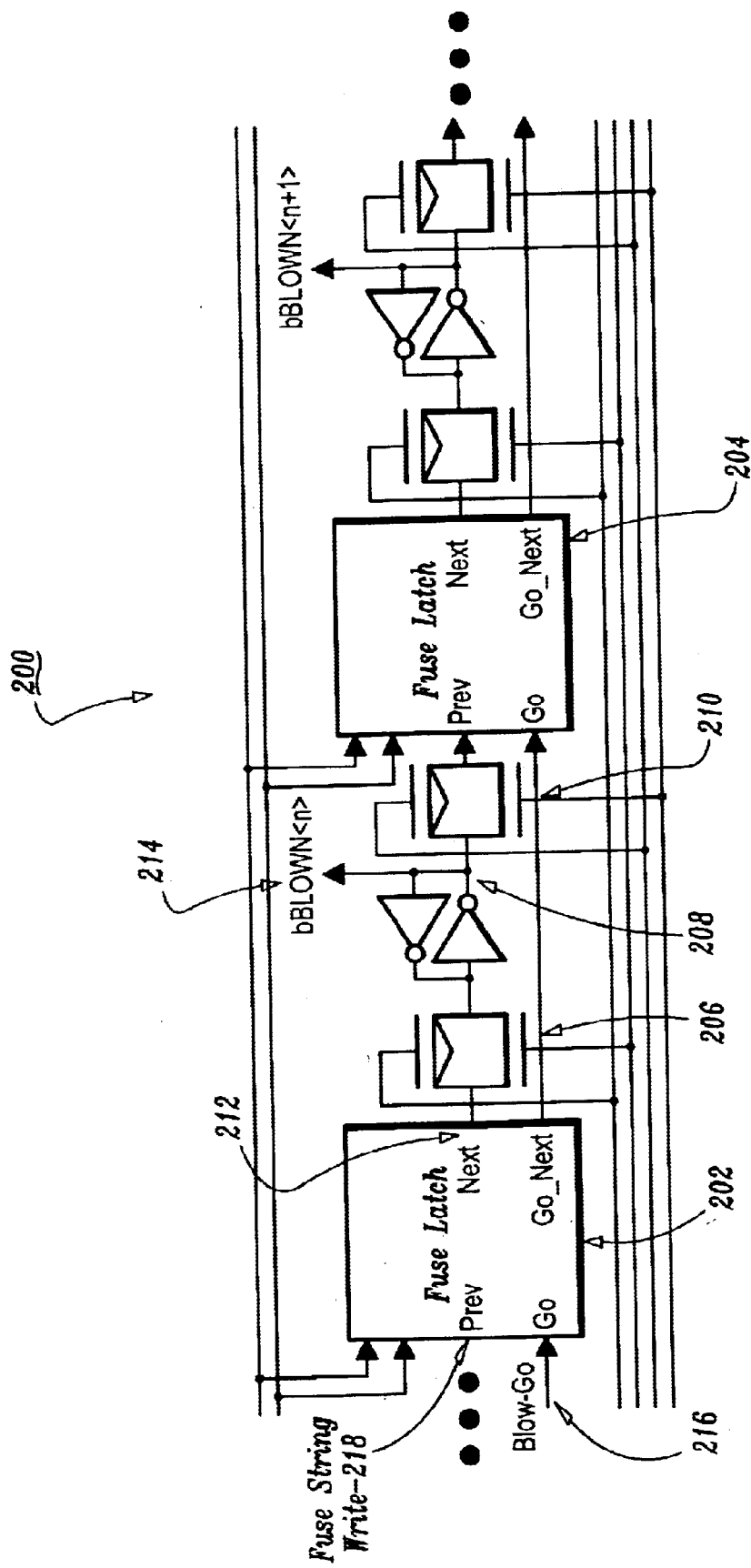
FIG. 2 depicts fuse latches as part of a shift register configuration.

Referring to FIG. 2, the plurality of fuse latch circuits depicted in FIG. 1, are shown with additional detail as part of a shift register configuration 200. The fuse latches 202, 204 are connected through switches 206, 210 and intermediate latches 208 to realize the shift register functionality. The shift register functionality is used to write fuse blow information into each fuse latch, fuse string write 218, or to read out fuse status information, fuse string read. The individual fuse information can be accessed directly at each fuse latch port, "Next" 212. The individual fuse information can also be accessed at the net, "bBLOWN<n>" 214, provided the switch 206 is kept open and the switch 210 is kept closed during the time when the fuse information is required. A Blow_Go signal 216 is fed into the shift register configuration 200. If the fuse string write 218 information indicates that the fuse is to be blown, a blow transistor (not shown) is opened and the fuse is blown. Otherwise, the Blow_Go signal 216 is automatically gated through to a next fuse latch for further fuse processing.

Figure 3:
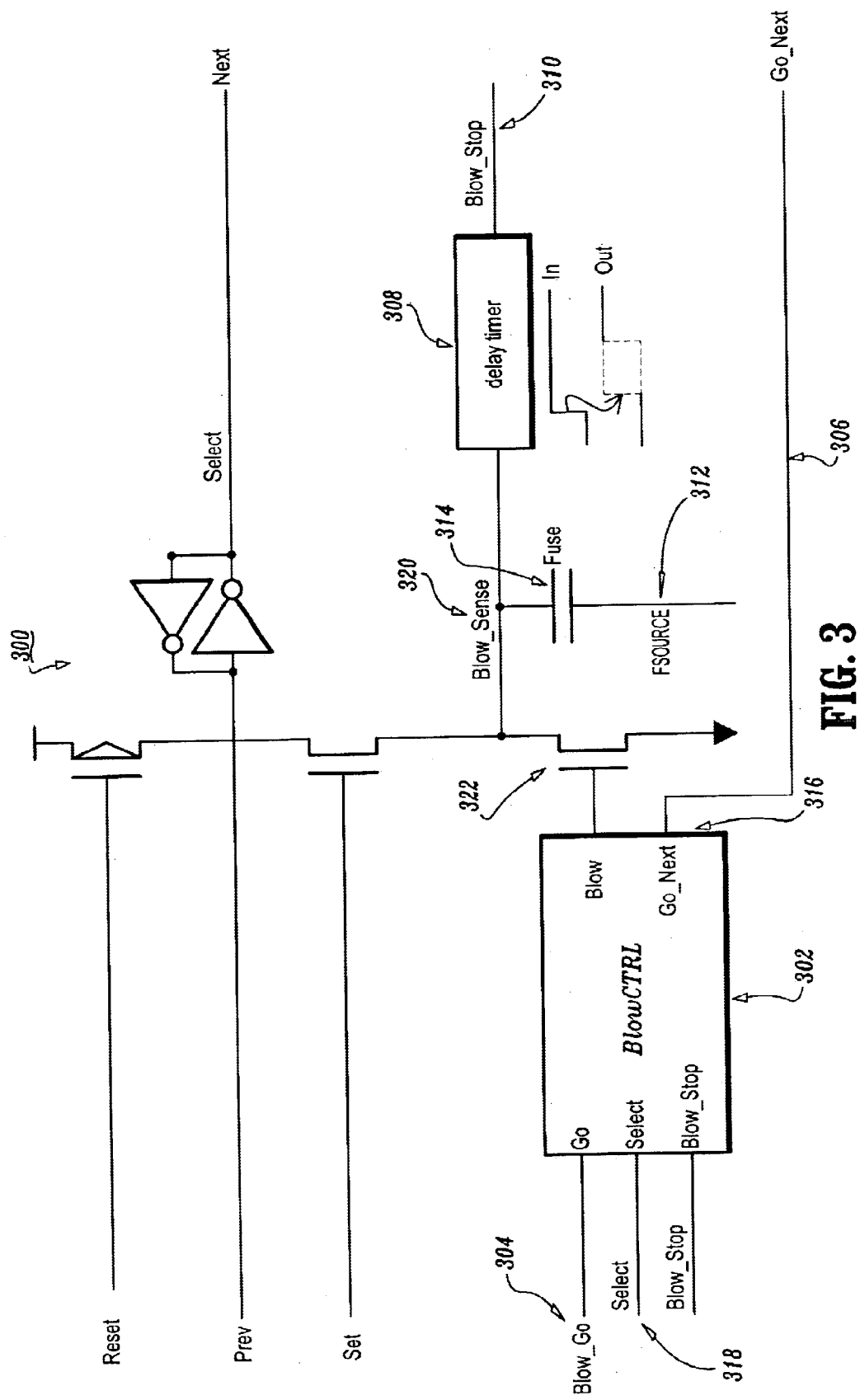
FIG. 3 is a fuse latch circuit with delay timer and blow-control circuits.

FIG. 3 depicts a fuse latch 300 using a fuse Select signal 318 which indicates if a specific fuse is to be blown or not. The port "FSOURCE" 312 provides the blow voltage and is set to the appropriate fuse blow voltage during the fuse blow process. Once the blow control circuit ("Blow-CTRL") 302 receives the Blow_Go signal 304, a signal evaluator circuit (not shown) within the blow control circuit 302 evaluates the Select signal 318. If the fuse 314 is not to be blown, the blow control circuit 302 immediately forwards the Blow_Go signal 304 to the Go_Next 316 automatic gater, which feeds into the following fuse latch. If the fuse 314 is to be blown, the port FSOURCE 312 provides the necessary blow voltage and the fuse 314 is blown only if a fuse switch 322 is open, thereby permitting the blow voltage to reach the fuse. For the fuse 314 shown in FIG. 3, once the fuse starts to blow, the resistance of the fuse decreases and blow sense voltage is increased.

A "delay timer" circuit 308 waits until it detects the Blow_Sense 320 status of the fuse 314. From the moment that the delay timer circuit 308 determines the fuse 314 is blown, a programmable timer within the circuit is started ($0<=t<=t_{max}$) for a controlled after-blow time t. After expiration of the programmable timer within the delay timer circuit 308, a Blow_Stop signal 310 is issued which causes the blow control circuit 302 to shut off a blow device. The Go_Next signal 306 continues this process for the next fuse latch until successful blow completion of all to-be-blown fuses.

Figure 4:
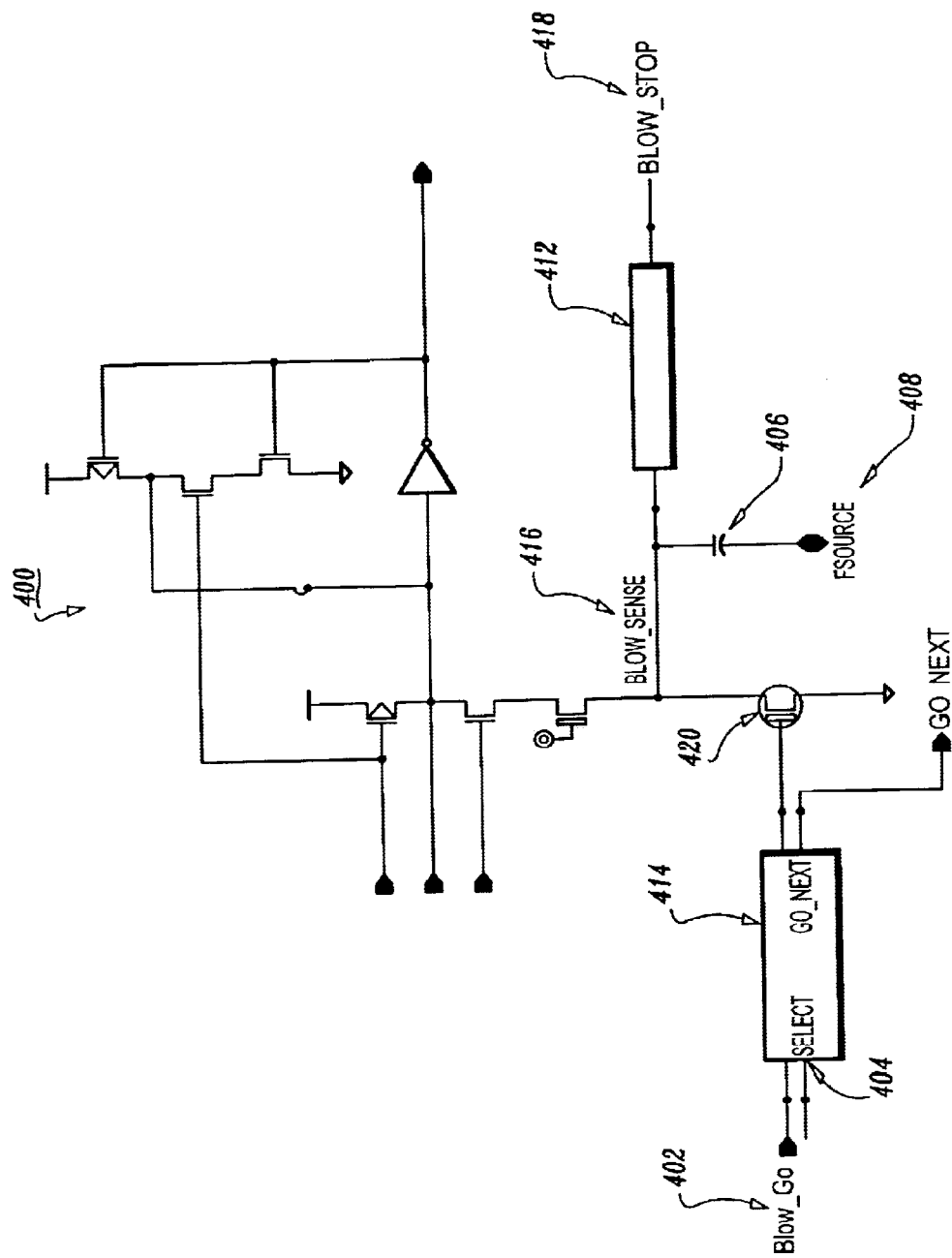
FIG. 4 shows an embodiment of a fuse latch circuit according to the present invention.

Referring to FIG. 4, an embodiment of a fuse latch 400 according to the present invention, is shown. A Blow_signal 402 and a Select signal 404 are fed into the blow control circuit 414. When the Select signal 404 is evaluated by a signal evaluator circuit (not shown) within the blow control circuit 414, a determination is made as to whether a fuse 406 should be blown. If the signal evaluator based on the Select signal 404 determines that the fuse 406 should be blown, the port FSOURCE 408, supplies an appropriate amount of voltage to blow the fuse 406. Fuse 406 will blow only if fuse switch 420 is open. A delay timer 412 waits for the fuse 406 to be blown. Upon the fuse 406 being blown, a Blow_Sense signal 416 is detected by the delay timer 412 and the delay timer 412 is activated. Continued fuse blow processing waits, until the delay timer 412 has expired. Once the delay timer 412 has expired, a Blow_Stop signal 418 is issued to shut down a blow device. This ensures the shut down of a blow device after the fuse 406 has been completely blown. After the fuse 406 is completely blown or immediately in case the Select signal 404 indicates that the fuse 406 does not need to be blown, the Blow_Go signal 402 is automatically gated through, Go_Next 410, to the next fuse latch.

Figure 5:
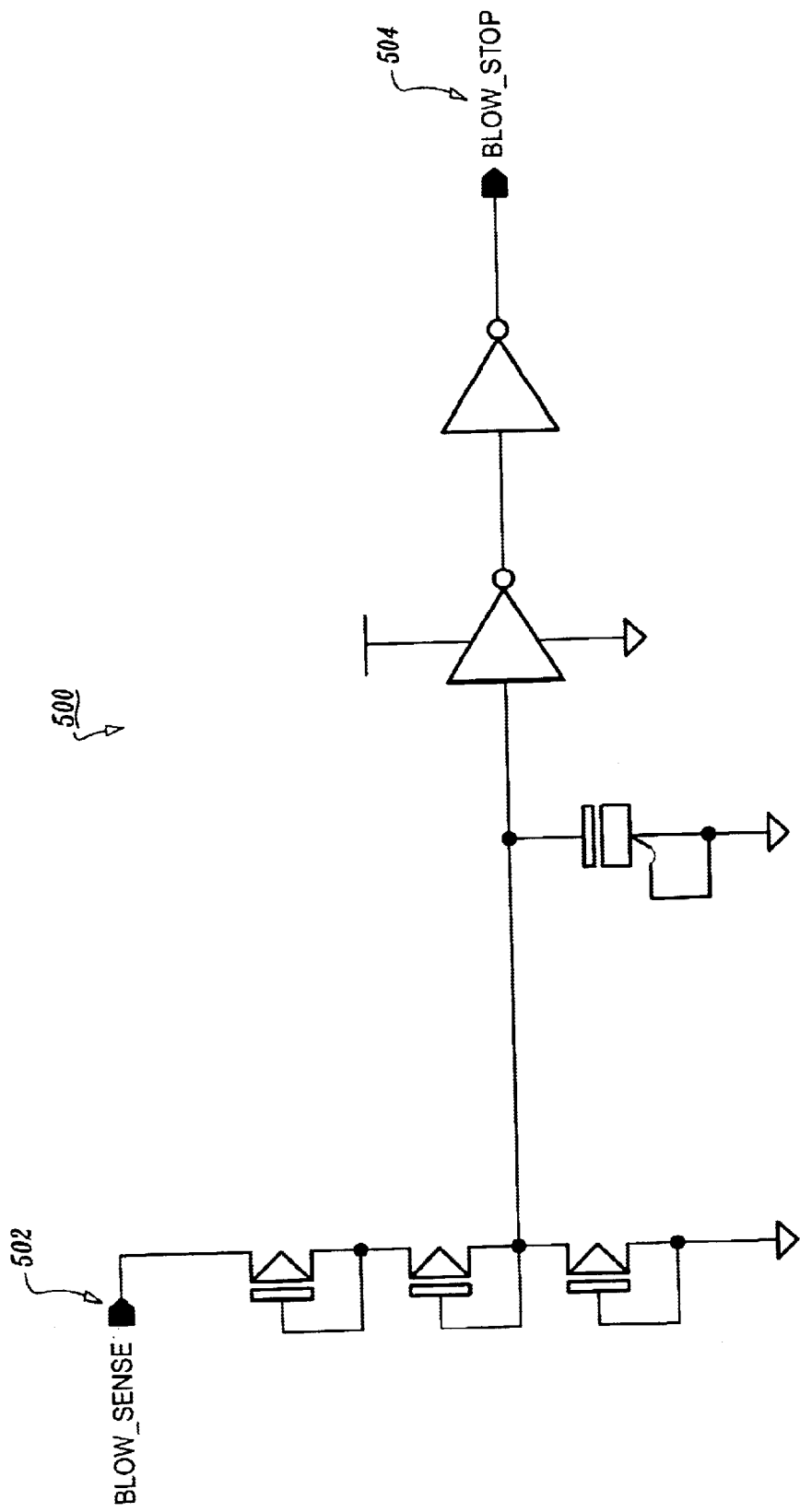
FIG. 5 shows an embodiment of blow detection and delay timer circuitry.

Referring to FIG. 5, an embodiment for a fuse blow detection and delay timer circuit 500 is shown. Fuse blow detection is determined by a Blow_Sense device 502. A delay timer circuit 500 waits until the Blow_Sense device 502 signals a fuse has been blown. If a fuse has been blown, the delay timer circuit 500 is activated and further fuse processing waits until expiration of the delay timer circuit 500. Upon expiration, the delay timer circuit 500 sends a Blow_Stop signal 504 that will shut off a blow device.

Figure 6:
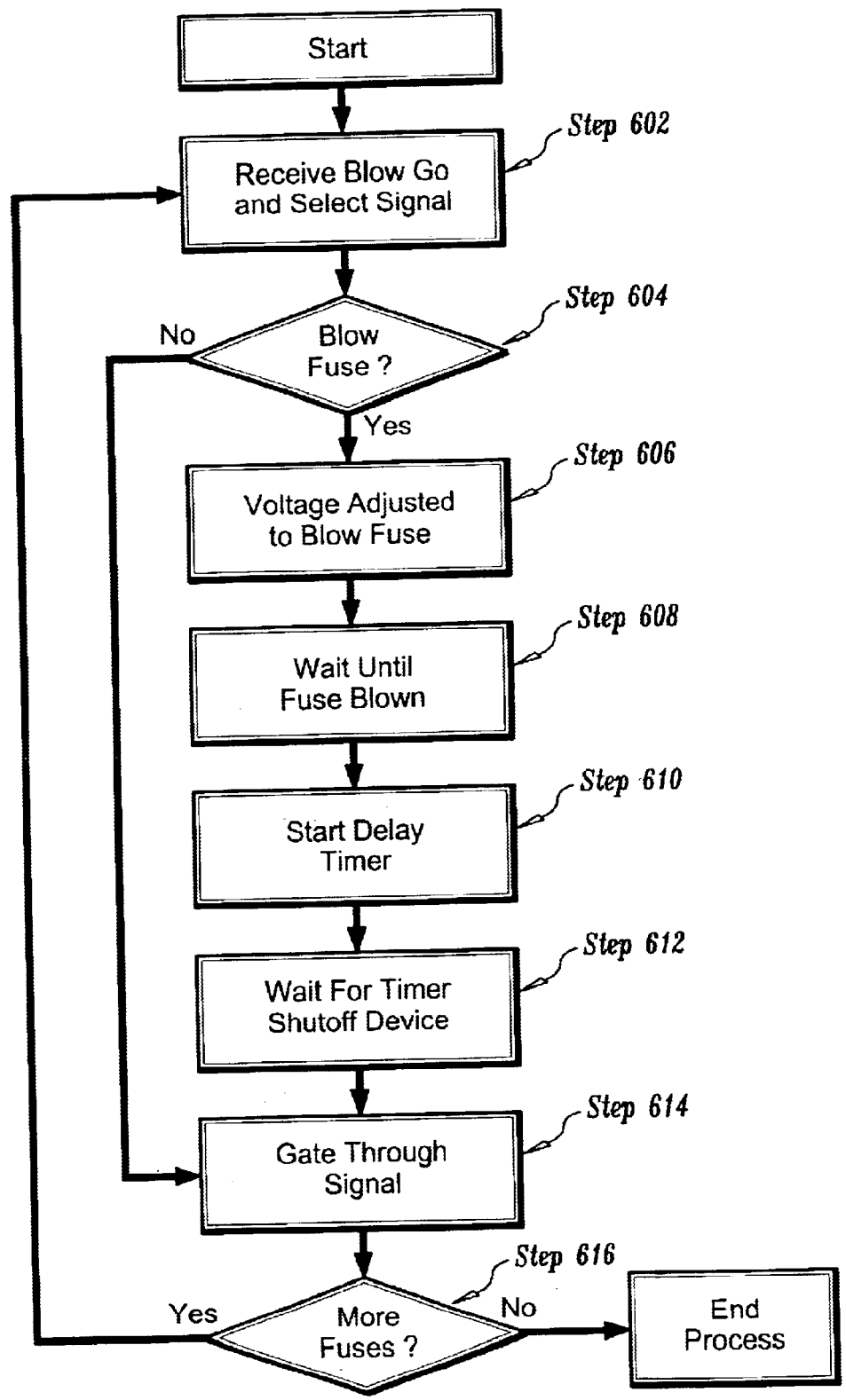
FIG. 6 shows a flow diagram illustrating a method according to an embodiment of the present invention.

FIG. 6 depicts a method for controlling fuse blow within a circuit according to the present invention. A Blow_Go and Select signal are received by a blow control circuit (step 602). The blow control circuit can have a signal evaluator that evaluates the Select signal to determine if the Blow_Go signal should blow a fuse (step 604). If a fuse is not to be blown, the Blow_signal is automatically gated through to the next fuse latch (step 614). If the fuse is to be blown, an appropriate amount of voltage is applied and a fuse begins to be blown (step 606). The fuse blow processing waits until the blow control circuit determines that the fuse is completely blown (step 608). Once a determination is made by the blow control circuit that the fuse is completely blown, a delay timer circuit is started (step 610). Further fuse blow processing waits until expiration of a predetermined blow time set within the delay timer circuit (step 612). After expiration of the predetermined time period, a blow device that was connected to the fuse is shut off and the Blow_Go signal is gated through to the next fuse latch (step 614). The gating through of the Blow_Go signal continues until it is determined that there are no more fuses to be blown (step 616).

Referring to FIG. 7 which shows a truth table for the blow control circuit 302 in FIG. 3. Row 1 of the truth table depicts that the Blow_Go signal has not been received yet. Row 2 of the truth table depicts a Blow_Go signal, value 1, without a corresponding Select signal, value 0, therefore no fuse will be blown and the Blow_Go signal will be automatically gated through, Go_Next, value 1, to the next fuse latch. Row 3 of the truth table depicts a Blow_Go signal, value 1, corresponding to a Select signal, value 1, and resulting in a Blow, value 1, of a fuse within the fuse latch. Here the Go_Next has a value of 0 indicating that no further fuses are to be blown since the ongoing fuse blow process is not completed. Blow_Stop has a value of 0, indicating not to shut down a blow device. Row 4 of the truth table depicts a Blow_Go signal, value 1, a Select signal, value 1, a Blow_Stop signal, value 1, for shutting off a Blow device, and a Go_Next signal, value 1, for automatically gating through the Blow_Go signal, value 1, to the next fuse latch.

While preferred embodiments have been shown and described, various modifications and substitutions may be made thereto without departing from the spirit and scope of the invention. All such changes and modifications are intended to be included within the scope of the present disclosure as set forth in the appended claims.

What is claimed is:

1. A method for controlling fuse blow, comprising the steps of:

feeding a first signal into at least one of a plurality of fuse latches wherein said plurality of fuse latches are connected to each other;

blowing at least one of a plurality of fuses within said at least one of a plurality of fuse latches, wherein said at least one of a plurality of fuses to be blown is identified by address information serially stored within each fuse latch;

automatically feeding said first signal to a next fuse latch within said plurality of fuse latches; and repeating said automatic feeding of said first signal into each of the remaining fuse latches of said plurality of fuse latches until fuse blow completion of all fuses identified by said address information serially stored within each fuse latch, as to be blown.

2. The method of claim 1, wherein said at least one of a plurality of fuses to be blown, within at least one of said plurality of fuse latches, is identified by a second signal.

3. The method of claim 2, further including the steps of:

feeding a second signal into a blow control circuit;

evaluating said second signal to determine if said first signal should blow said at least one of a plurality of fuses within at least one of said plurality of fuse latches, wherein if said at least one of a plurality of fuses is not to be blown, automatically feeding said first signal to at least one of the remaining fuse latches of said plurality of fuse latches;

otherwise blowing said at least one of a plurality of fuses, shutting off a blow device, automatically feeding said first signal to at least one of the remaining fuse latches of said plurality of fuse latches; and repeating said automatic feeding of said first signal and evaluation of said second signal until blow completion of all fuses that are identified by said second signal as to be blown, within said plurality of fuse latches.

4. The method of claim 3, further including the step of starting a delay timer after a fuse is blown.

5. The method of claim 4, further including the step of waiting for the expiration of said delay timer before shutting off a blow device.

6. The method of claim 5, further including the step of shutting off a blow device after expiration of said delay timer.

7. The method of claim 4, further including the step of programming said delay timer for an adjustable time period.

8. A circuit for processing a digital input signal, comprising:
- a first input side for receiving a first signal;
- a fuse blow circuit for blowing at least one of a plurality of fuses, wherein said first signal activates said fuse blow circuit; and
- a first output side for supplying said first signal to a next fuse latch, after said at least one of a plurality of fuses is blown.

9. The circuit according to claim 8, further including:
- a second input side for receiving a second signal; and
- a signal evaluator circuit for evaluating said second signal to determine if said first signal should activate said fuse blow circuit to blow said at least one of a plurality of fuses.

10. The circuit according to claim 9, further including:
- a delay timer circuit for controlling after-blow time.

11. The circuit according to claim 10, wherein said delay timer circuit is programmable.

12. The circuit according to claim 11, further including:
- a blow device shutoff circuit for shutting off a blow device after expiration of said after-blow time.

13. A circuit for processing a digital input signal, comprising:
- a first input means for receiving a first signal;
- a fuse blow means for blowing at least one of a plurality of fuses, wherein said first signal activates said fuse blow means; and
- a first output means for supplying said first signal to a next fuse latch, after said at least one of a plurality of fuses is blown.

14. The circuit according to claim 13, further including:
- a second input means for receiving a second signal; and
- a signal evaluator means for evaluating said second signal to determine if said first signal should activate said fuse blow means to blow said at least one of a plurality of fuses.

15. The circuit according to claim 14, further including:
- a delay timer means for controlling after-blow time.

16. The circuit according to claim 15, wherein said delay timer means is programmable.

17. The circuit according to claim 16, further including:
- a blow device shutoff means for shutting off a blow device after expiration of said after-blow time.

* * * * *